(12) United States Patent
Benaissa et al.

(10) Patent No.: US 11,329,188 B2
(45) Date of Patent: May 10, 2022

(54) OPTOELECTRONIC DEVICE MANUFACTURING METHOD

(71) Applicant: Commissariat à l'Énergie Atomique et aux Énergies Alternatives, Paris (FR)

(72) Inventors: Lamine Benaissa, Massy (FR); Marc Rabarot, Saint-Egreve (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/991,857

(22) Filed: Aug. 12, 2020

(65) Prior Publication Data

US 2021/0050476 A1    Feb. 18, 2021

(30) Foreign Application Priority Data

Aug. 16, 2019   (FR) ...................................... 1909238

(51) Int. Cl.
*H01L 33/00*   (2010.01)
(52) U.S. Cl.
CPC ........ *H01L 33/0095* (2013.01); *H01L 33/007* (2013.01); *H01L 33/0093* (2020.05); *H01L 2933/0066* (2013.01)
(58) Field of Classification Search
None
See application file for complete search history.

(56) References Cited

U.S. PATENT DOCUMENTS

| 2015/0333047 A1* | 11/2015 | Pfeuffer | H01L 25/0753 |
| | | | 257/88 |
| 2019/0051637 A1 | 2/2019 | Lo et al. | |
| 2019/0051792 A1 | 2/2019 | Lo et al. | |
| 2019/0229149 A1 | 7/2019 | Yoo | |

FOREIGN PATENT DOCUMENTS

| WO | WO 2008/062783 A1 | 5/2008 |
| WO | WO 2018/116814 A1 | 6/2018 |

OTHER PUBLICATIONS

English translation of WO 2008/062783 by google patents (Year: 2008).*
Preliminary Search Report for French Application No. 1909238, dated Mar. 13, 2020.

* cited by examiner

*Primary Examiner* — Bradley Smith
(74) *Attorney, Agent, or Firm* — Wolf, Greenfield & Sacks, P.C.

(57) ABSTRACT

A method of manufacturing electronic devices, including the successive steps of: a) growing, on a surface of a first substrate, a stack including at least one semiconductor layer; b) bonding a second substrate on a surface of the stack opposite to the first substrate, and then removing the first substrate; c) bonding a third substrate to a surface of the stack opposite to the second substrate, and then removing the second substrate; d) cutting the assembly including the third substrate and the stack into a plurality of first chips each including a portion of the stack; and e) bonding each first chip, by its surface opposite to the third substrate, to a surface of a fourth semiconductor substrate inside and on top of which a plurality of integrated control circuits have been previously formed.

18 Claims, 4 Drawing Sheets

OPTOELECTRONIC DEVICE MANUFACTURING METHOD

This application claims the priority benefit of French patent application number FR19/09238, the content of which is hereby incorporated by reference in its entirety to the maximum extent allowable by law.

TECHNICAL BACKGROUND

The present disclosure generally concerns the field of optoelectronic devices. It more specifically relates to a method of manufacturing optoelectronic devices each comprising a plurality of semiconductor diodes, for example, gallium nitride diodes, and an electronic circuit for controlling the diodes.

PRIOR ART

Emissive display devices comprising an array of gallium nitride (GaN) light-emitting diodes (LEDs), and an electronic control circuit enabling to individually control the LEDs to display images, have already been provided.

To form such a device, it may be provided to separately manufacture the control circuit and the LED array, and then to hybridize them, that is, to stack them while connecting them to each other.

A disadvantage of such a manufacturing method is the need to accurately align the control circuit and the LED array during the step of assembly of the two elements, so that each LED is effectively positioned on a metal pad corresponding thereto in the control circuit. Such an alignment is particularly difficult to achieve when the pitch between pixels decreases, and is an obstacle to an increase in the resolution and/or in the integration density of the pixels.

To overcome such a disadvantage, it has been provided, particularly in international patent applications No WO2017194845 (DD16946/B15015) and No WO2019092357 (DD17951/B16061) previously filed by the applicant, as well as in French patent application Nr. 18/68201 (DD18759/B17108) filed by the applicant on Sep. 13, 2018, to:

first form the control circuit in the form of an integrated circuit comprising, on a surface, a plurality of metal pads intended to be connected to the LEDs to be able to individually control the current flowing through each LED;

then transfer onto the surface of the control circuit comprising the metal pads an active LED stack continuously extending over the entire surface of the control circuit to connect a semiconductor layer of the stack to the metal pads of the control circuit; and then structure the active LED stack to delimit and insulate from one another the different LEDs of the device.

An advantage of such a manufacturing method is that, during the step of transfer of the active LED stack onto the control circuit, the positions of the different LEDs of the device in the active stack have not been defined yet. There is accordingly no strong alignment accuracy constraint during the transfer. The delimitation of the different LEDs in the active stack can then be performed by methods of substrate structuring and of deposition of insulating and conductive layers on a substrate, which provide an alignment accuracy much greater than the accuracy that can be obtained on transfer of a substrate onto another one.

It would however be desirable to at least partly improve certain aspects of the methods described in the above-mentioned International patent applications Nr. WO2017194845 and Nr. WO2019092357 and French patent application No 18/68201.

SUMMARY

For this purpose, an embodiment provides a method of manufacturing electronic devices, comprising the successive steps of:

a) growing, on a surface of a first substrate, a stack comprising at least one semiconductor layer;

b) bonding a second substrate to a surface of the stack opposite to the first substrate, and then removing the first substrate;

c) bonding a third substrate to a surface of the stack opposite to the second substrate, and then removing the second substrate;

d) cutting the assembly comprising the third substrate and the stack into a plurality of first chips, each comprising a portion of the stack; and e) bonding each first chip, by its surface opposite to the third substrate, to a surface of a fourth semiconductor substrate inside and on top of which a plurality of integrated control circuits have been previously formed.

According to an embodiment, each control circuit comprises a plurality of metal connection pads and, at step e), the first chips are arranged respectively opposite the control circuits, so that, in each first chip, said at least one semiconductor layer of the stack is electrically connected to the metal pads of the corresponding control circuit.

According to an embodiment, the method further comprises, after step e), the step of:

f) cutting the assembly comprising the fourth semiconductor substrate and the first chips into a plurality of electronic devices, each comprising one of said integrated control circuits and the corresponding portion of the stack.

According to an embodiment, the method further comprises, after step e) and before step f), a step of removal of the third substrate in each first chip.

According to an embodiment, the method further comprises, after step e) and before step f), a step of forming, in each of said portions of the stack, trenches delimiting a plurality of individually-controllable components.

According to an embodiment, at step b), the second substrate is bonded to the surface of the stack opposite to the first substrate by direct bonding of a first metal layer previously deposited on the surface of the stack opposite to the first substrate with a second metal layer previously deposited on the second substrate.

According to an embodiment, the first and second metal layers are made of titanium.

According to an embodiment, at step b), the second substrate is bonded to the surface of the stack opposite to the first substrate by direct bonding of a first dielectric layer previously deposited on the surface of the stack opposite to the first substrate to a second dielectric layer previously deposited on the second substrate.

According to an embodiment, the first and second dielectric layers are made of silicon oxide.

According to an embodiment, at step c), the third substrate is bonded to the surface of the stack opposite to the second substrate by means of a bonding layer made of polymer material.

According to an embodiment, at step c), the third substrate is bonded to the surface of the stack opposite to the second substrate by direct oxide-to-oxide bonding.

The method according to any of claims 1 to 11, further comprising, after step b) and before step c), a step of thinning said at least one semiconductor layer from its surface opposite to the second substrate.

According to an embodiment, the method further comprises, after step b) and before step c), a step of forming of nanostructures in said at least one semiconductor layer, on the side of its surface opposite to the second substrate.

According to an embodiment, the first substrate is made of sapphire.

According to an embodiment, said at least one semiconductor layer comprises gallium nitride.

According to an embodiment, the stack is a diode stack comprising, in the following order from said surface of the first substrate, first and second semiconductor layers of opposite conductivity types.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of an integrated semiconductor diode control circuit has not been detailed, the described embodiments being compatible with usual structures and methods of manufacturing such control circuits. Further, the composition and the layout of the different layers of an active semiconductor diode stack have not been detailed, the described embodiments being compatible with usual active stacks of semiconductor diodes, particularly gallium nitride diodes.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

Unless specified otherwise, the expressions "around", "approximately", "substantially" and "in the order of" signify within 10%, and preferably within 5%.

FIGS. 1 to 7 are cross-section views illustrating successive steps of an embodiment of a method of manufacturing display devices, each comprising a LED array, and an electronic control circuit enabling to individually control the LEDs in order to display images.

Figure 1:
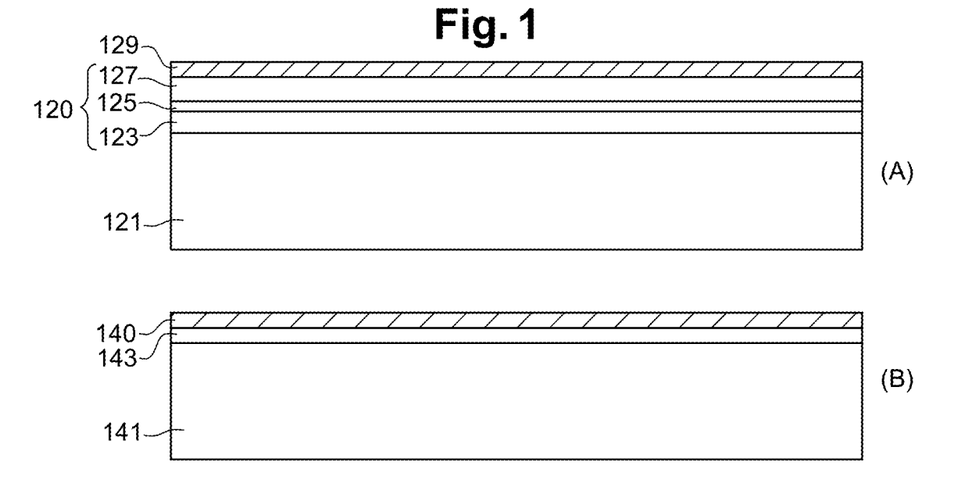
FIG. 1 schematically illustrates a step of a method of manufacturing an optoelectronic device according to an embodiment.

FIG. 1 comprises a view (A) showing a structure obtained at the end of steps of forming of an active LED stack 120 on a surface, the upper surface in the orientation of FIG. 1, of a growth substrate 121. Active LED stack 120 is for example a gallium nitride LED stack. Active LED stack 120 is deposited by epitaxy on the upper surface of substrate 121. Preferably, substrate 121 is a sapphire substrate. Sapphire indeed has the advantage of allowing the growth of a high-quality gallium nitride LED stack. In the shown example, stack 120 comprises, in the following order from the upper surface of substrate 121, an N-type doped gallium nitride layer 123, an emissive layer 125, and a P-type doped gallium nitride layer 127. Emissive layer 125 is for example formed of a stack of one or a plurality of emissive layers, each forming a quantum well, for example, containing GaN, InN, InGaN, AlGaN, AlN, AlInGaN, GaP, AlGaP, AlInGaP, or a combination of one or a plurality of these materials. As a variation, emissive layer 125 may be an intrinsic, that is, non-intentionally doped, gallium nitride layer, for example having a residual donor concentration in the range from $10^{15}$ to $10^{18}$ atoms/cm$^3$, for example, in the order of $10^{17}$ atoms/cm$^3$. In this example, the lower surface of emissive layer 125 is in contact with the upper surface of layer 123, and the upper surface of emissive layer 125 is in contact with the lower surface of layer 127. In practice, a stack of one or a plurality of buffer layers (not shown—for example, an undoped gallium nitride "U-GaN" layer) may form an interface between substrate 121 and gallium nitride layer 123. As an example, the thickness of layer 123 is in the range from 0.2 to 2 μm, for example, in the order of 1 μm. As an example, the thickness of layer 125 is in the range from 30 to 300 nm, for example, in the order of 100 nm. As an example, the thickness of layer 127 is in the range from 5 to 300 nm, for example, in the order of 100 nm. Stack 120 for example extends continuously and across a uniform thickness over the entire upper surface of substrate 121.

The structure of view (A) of FIG. 1 further comprises, on the upper surface of active diode stack 120, a metal layer 129. In the shown example, metal layer 129 is deposited on top of and in contact with the upper surface of gallium nitride layer 127. Metal layer 129 for example substantially coats the entire upper surface of active stack 120. Metal layer 129 is for example deposited by a vacuum deposition method, for example, by physical vapor deposition (PVD), by vacuum sputtering, by chemical vapor deposition (CVD) or by vacuum evaporation deposition (EVAP). Metal layer 129 particularly has a function of electric contacting with the semiconductor layer 127 of the LED stack. Metal layer 129 may further have the function of an optical reflector (mirror), the function of a barrier to the diffusion of metal elements, and/or the function of an element for bonding active stack 120 to another substrate by direct metal-to-metal bonding.

As an example, metal layer 129 is formed of a stack of a plurality of different metal layers (not detailed in the drawings) comprising, in the following order from the upper surface of semiconductor layer 127:
- a first metal layer, for example, made of nickel, of indium, of titanium, or of an indium tin oxide (ITO), in contact with the upper surface of semiconductor layer 127 and allowing an electric contact with semiconductor layer 127;
- a second metal layer, for example, made of aluminum, of silver, or of platinum, in contact with the upper surface of the first metal layer, having an optical reflector function;
- a third metal layer, for example, made of titanium nitride or of tantalum nitride, in contact with the upper surface of the second metal layer, forming a barrier to the diffusion of metal elements; and
- a fourth metal layer, for example, made of titanium, in contact with the upper surface of the third metal layer, intended to ensure the subsequent bonding of stack 120 to a transfer substrate by direct metal-to-metal bonding.

As an example, the first, second, third, and fourth metal layers of layer 129 respectively have thicknesses in the order of 5 nm, 100 nm, 25 nm, and 500 nm.

FIG. 1 further comprises a view (B) illustrating a structure obtained at the end of a step of forming of a metal bonding layer 140 on a surface, the upper surface in the orientation of FIG. 1, of a first temporary transfer substrate 141. Substrate 141 is for example made of silicon. Metal bonding layer 140 is preferably made of the same material as the upper portion of metal layer 129, for example, of titanium. Metal layer 140 is for example deposited by a vacuum deposition method, for example, by PVD, by vacuum sputtering, or by CVD. The thickness of metal bonding layer 140 is for example in the order of 10 nm. Layer 140 for example continuously extends over the entire upper surface of substrate 141.

In the shown example, prior to the deposition of metal bonding layer 140, an etch stop layer 143 is deposited on the upper surface of temporary transfer substrate 141. Layer 143 is for example made of aluminum nitride (AlN). Layer 143 preferably continuously extends over the entire upper surface of substrate 141. The thickness of layer 143 is for example in the order of 10 nm. As an example, layer 143 is in contact, by its lower surface, with the upper surface of substrate 141 and, by its upper surface, with metal bonding layer 140.

Figure 2:
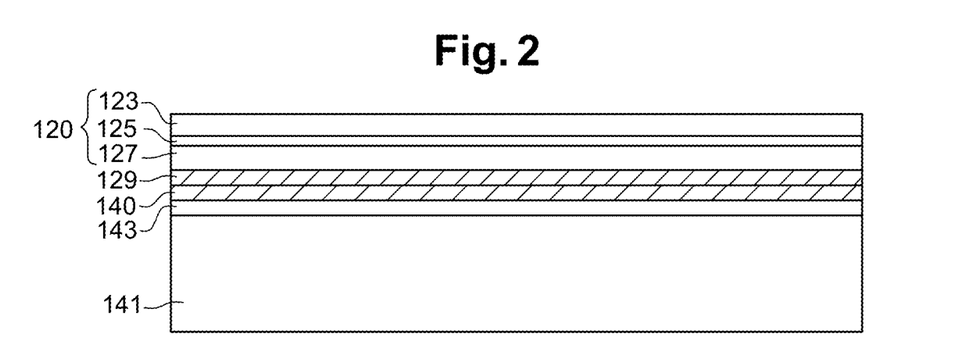
FIG. 2 schematically illustrates another step of a method of manufacturing an optoelectronic device according to an embodiment.

FIG. 2 illustrates the structure obtained at the end of a step of transfer and bonding of active LED stack 120 on the upper surface of temporary transfer substrate 141. For this purpose, the assembly comprising growth substrate 121, active LED stack 120, and metal layer 129 may be flipped and transferred onto temporary substrate 141 to place the upper surface (in the orientation of view (A) of FIG. 1) of metal layer 129 in contact with the upper surface of metal layer 140. In this example, the bonding of active stack 120 to temporary transfer substrate 141 is obtained by direct bonding of the lower surface (in the orientation of FIG. 2) of metal layer 129 to the upper surface of metal layer 140. Direct bonding here means a bonding with no added intermediate material between the two assembled surfaces, for example, a molecular bonding, a thermocompression bonding, or also a eutectic bonding. As an example, the bonding is performed at room temperature and followed by an anneal at a temperature in the order of 200° C. Prior to the bonding, a step of preparation of the external surfaces of metal layers 129 and 140 to be assembled, for example, by chemical-mechanical polishing, may be provided to obtain a relatively low surface roughness of the metal layers 129 and 140 to be assembled, for example, smaller than 0.5 nm RMS.

Once active LED stack 120 has been bonded to the upper surface of temporary transfer substrate 141, growth substrate 121 is removed to expose the upper surface (in the orientation of FIG. 2) of semiconductor layer 123. Substrate 121 is for example separated from active stack 120 by means of a laser beam projected through substrate 121 from its surface opposite to active stack 120 (laser lift-off method). A step of chemical cleaning of the upper surface of semiconductor layer 123 (or of the undoped gallium nitride buffer layer), for example, by means of a hydrogen chloride solution, may be implemented after the removal of substrate 121.

Figure 3:
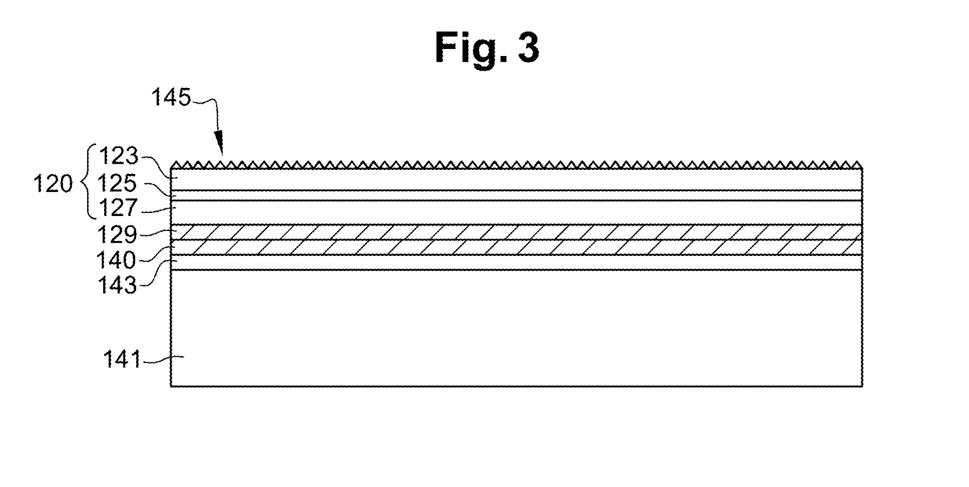
FIG. 3 schematically illustrates another step of a method of manufacturing an optoelectronic device according to an embodiment.

FIG. 3 illustrates the structure obtained at the end of a subsequent step of thinning and then of nanostructuring of semiconductor layer 123 (and/or of the undoped gallium nitride buffer layer), from its surface opposite to temporary substrate 141, that is, its upper surface in the orientation of FIG. 3.

First, layer 123 may be thinned from its upper surface, for example, by plasma etching, for example, by ICP-type ("Inductively Coupled Plasma") etching or by ion beam etching IBE. During this step, layer 123 (and/or the undoped gallium nitride buffer layer) is uniformly thinned over substantially its entire surface.

Then, a step of structuring of the upper surface of layer 123 may be implemented. During this step, nanostructures 145 are formed in layer 123, for example, by lithography. The forming of nanostructures 145 for example comprises a step of forming of a resin mask (not shown in FIG. 3) on the upper surface of layer 123, followed by a step of etching of a portion of the thickness of layer 123 through openings of the mask. The openings of the mask, of nanometer-range dimensions, are for example formed by electron beam etching, or by a nanoimprint method. The etching of layer 123 through the openings of the mask to form nanostructures 145 is for example a plasma etching.

Nanostructures 145 advantageously enable to improve the extraction of the light emitted by the LEDs in the final device. As an example, the structures have, in top view, a square, triangular, circular, or hexagonal shape. The nanostructures for example have a width in the range from 100 to 800 nm and a height in the range from 100 to 400 nm.

Figure 4:
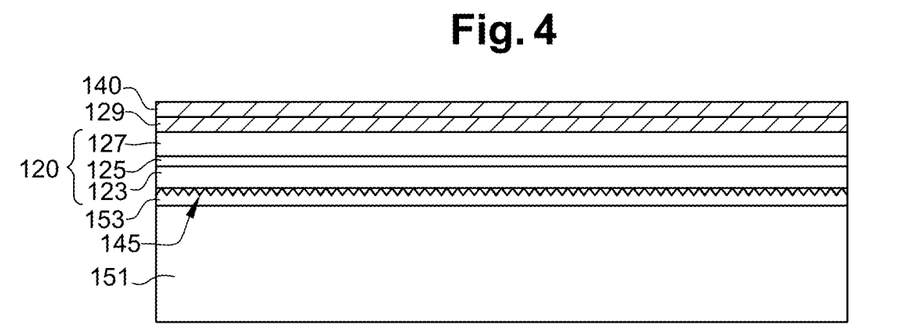
FIG. 4 schematically illustrates another step of a method of manufacturing an optoelectronic device according to an embodiment.

FIG. 4 illustrates the structure obtained at the end of a subsequent step of transfer and of bonding of active LED stack 120 to the upper surface of a second temporary transfer substrate 151. During this step, the assembly comprising first temporary substrate 141, layers 129, 140, and 143, and active LED stack 120, may be flipped (with respect to the orientation of FIG. 3) to bond the surface of LED stack 120 opposite to substrate 141 to the upper surface of substrate 151. The surface of semiconductor layer 123 opposite to substrate 141, that is, its lower surface in the orientation of FIG. 4, may be bonded to the upper surface of substrate 151 by means of a bonding layer 153 made of a polymer material. As an example, the bonding is performed at a temperature in the order of 200° C. with the application of a pressure between the two assembled elements.

Once active LED stack 120 has been bonded to the upper surface of the substrate, first temporary transfer substrate 141 and etch stop layer 143 are removed to expose the upper surface of metal layer 140. Substrate 141 is for example removed by grinding, and then by chemical or dry etching. Stop layer 143 may be removed by chemical or dry etching. A step of cleaning of the upper surface of metal layer 140, for example, by chemical-mechanical polishing and/or chemical cleaning, may be implemented after the removal of substrate 141 and of stop layer 143.

Figure 5:
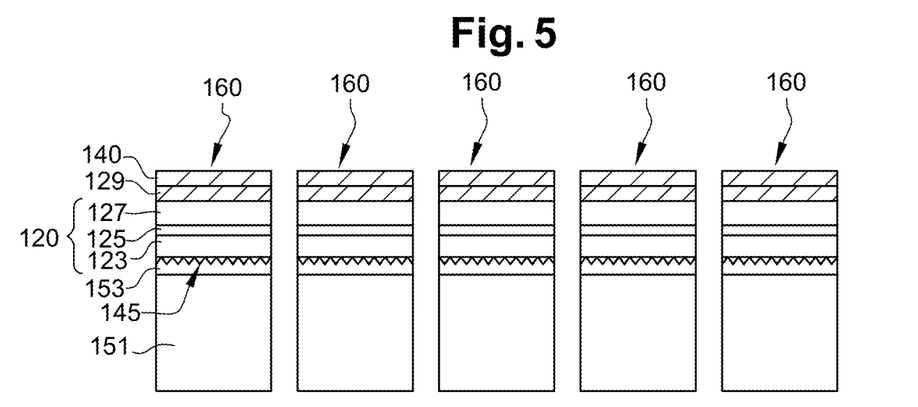
FIG. 5 schematically illustrates another step of a method of manufacturing an optoelectronic device according to an embodiment.

FIG. 5 illustrates a subsequent step of cutting of the assembly comprising substrate 151, bonding layer 153, active LED stack 120, and metal layers 129 and 140 into a plurality of elementary chips 160, for example, of same dimensions. The cutting of elementary chips 160 is for example performed by sawing. Each chip 160 comprises a portion of active LED stack 120 of dimensions substantially equal to the dimensions of the LED array of one of the display devices which are desired to be formed. At this stage, in each chip 160, each of layers 123, 125, and 127 of stack 120 and each of metal layers 129 and 140 extends continuously over substantially the entire chip surface. In other words, at this stage, the elementary LEDs of the display device have not been individualized yet.

Figure 6:
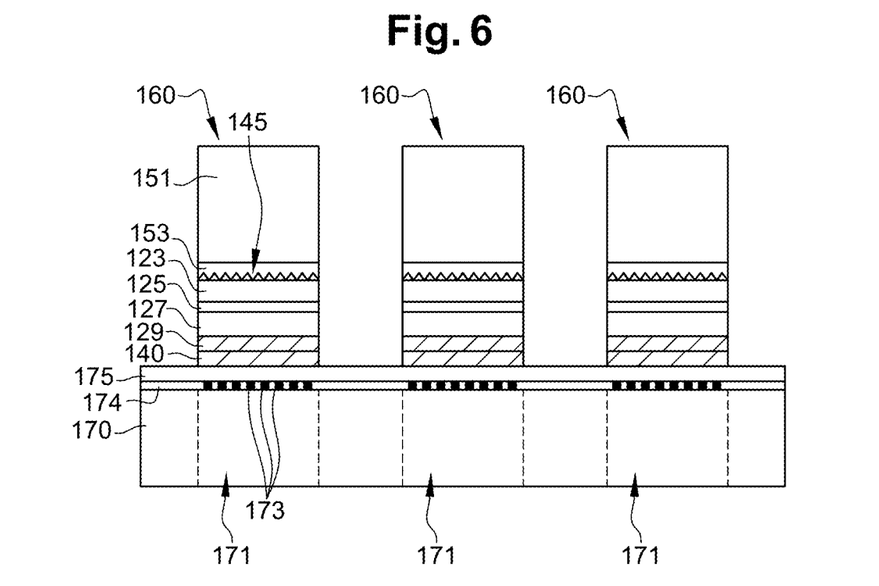
FIG. 6 schematically illustrates another step of a method of manufacturing an optoelectronic device according to an embodiment.

FIG. 6 illustrates a subsequent step of transfer of elementary chips 160 onto a semiconductor substrate 170, for example, made of silicon, inside and on top of which a plurality of integrated control circuits 171 have been previously formed. Control circuits 171 are for example formed in CMOS technology. Each control circuit 171 corresponds to the control circuit of one of the display devices which are desired to be formed. As an example, each control circuit 171 comprises, on its upper surface side, for each of the LEDs of the display device, metal connection pads 173 intended to be connected to one of the electrodes of the LED, to be able to control a current flowing through the LEDs and/or to apply a voltage across the LEDs. The control circuit further comprises, for each LED, connected to the metal pads 173 dedicated to the LED, an elementary control cell (not detailed) comprising one or a plurality of transistors, enabling to individually control the current flowing through the LED and/or a voltage applied across the LED. Metal pads 173 may be laterally surrounded with an insulating material 174, for example, silicon oxide, so that control circuit 171 has a substantially planar upper surface area comprising an alternation (or checkerboard) of metal regions 173 and of insulating regions 174.

In this example, prior to the transfer of chips 160 onto substrate 170, a metal bonding layer 175 is deposited over the upper surface of substrate 170. Metal layer 175 extends continuously over substantially the entire upper surface of substrate 170. Metal layer 175 particularly covers substantially the entire upper surface of each of control circuits 171. In particular, metal layer 175 is in contact with the metal connection pads 173 of each control circuit 171.

Metal layer 175 is for example made of the same material as metal layer 140, for example, of titanium. The thickness of metal layer 175 is for example in the order of 200 nm.

After the deposition of layer 175, a step of preparation of the upper surface of layer 175 may be provided, for example, by chemical-mechanical polishing, to obtain a relatively low surface roughness of layer 175, for example, smaller than 0.5 nm RMS.

Chips 160 are then transferred and bonded to substrate 170 by direct bonding of the surface of metal layer 140 opposite to substrate 151, that is, its lower surface in the orientation of FIG. 6, on the upper surface of metal layer 175. Each chip 160 is arranged opposite one of control circuits 171. During this step, the positions of the different LEDs of each display device in active stack 120 have not been defined yet. There is accordingly no strong constraint in terms of alignment accuracy during the transfer of chips 160 onto substrate 170. Chips 160 may be transferred one by one onto substrate 170, or collectively.

Figure 7:
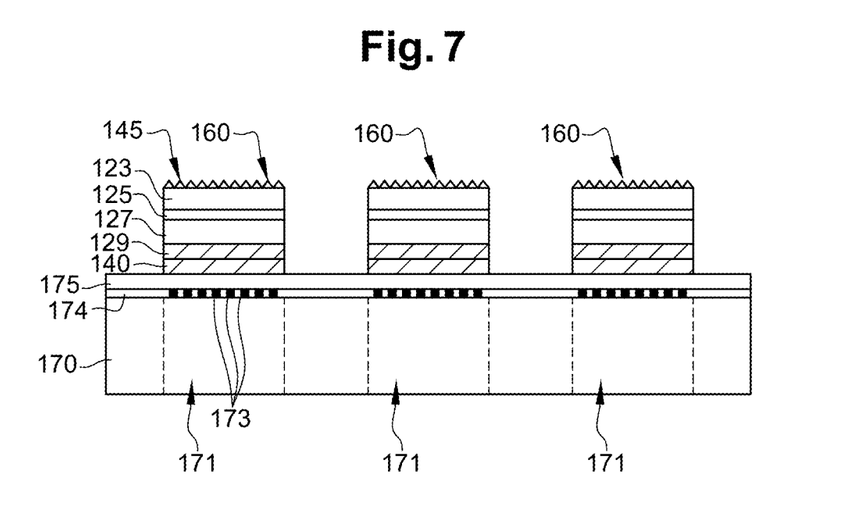
FIG. 7 schematically illustrates another step of a method of manufacturing an optoelectronic device according to an embodiment.

FIG. 7 illustrates the structure obtained at the end of a subsequent step of removal of the temporary substrate 151 of chips 160. The removal of substrate 151 may be performed by dissolution of the polymer glue layer 153, for example, by means of a chemical solution or by irradiation with an ultraviolet radiation (in the case of glass substrate 151).

An additional step (not detailed in FIG. 7) of deposition of a dielectric passivation layer on the upper surface of the structure may further be provided. As an example, a layer of a dielectric passivation material, for example, silicon oxide, is deposited over the entire surface of the structure of FIG. 7, across a thickness greater than the cumulated thickness of metal layers 140 and 129 and of active stack 120, after which the layer is planarized, for example, by chemical-mechanical polishing, to obtain an assembly having a substantially planar upper surface. As an example, at the end of the planarization step, the upper surface of semiconductor layer 123 is flush with the upper surface of the dielectric passivation layer (not shown).

At the end of the steps of FIG. 7, a substrate 170 inside and on top of which a plurality of control circuits 171 are integrated is obtained, each elementary control circuit being coated with a portion of active LED stack 120 continuously extending over substantially the entire surface of control circuit 171, the semiconductor layer 123 of active LED stack 120 being electrically connected to the metal pads 173 of the control circuit.

Subsequent step of delimitation and individualization of a plurality of elementary LEDs in each portion of active stack 120 are then implemented, by usual methods of semiconductor layer structuring and of deposition of insulating and conductive layers on a substrate. This method will not be detailed hereafter, the described embodiments being compatible with known methods of delimitation and individualization of elementary LEDs in an active LED stack previously transferred onto an integrated control circuit, for example, methods of the type described in one of or the two above-mentioned International patent applications Nr. WO2017194845 and Nr. WO2019092357 and/or in above-mentioned French patent application Nr. 18/68201. Such methods particularly comprise the forming, in each portion of active stack 120, of trenches delimiting a plurality of LEDs respectively connected to different metal pads 173 of the underlying control circuit 171.

At the end of the method of delimitation and individualization of the elementary LEDs, a structure comprising a plurality of display devices, each comprising a control circuit 171 integrated inside and on top of substrate 170 and an array of individually-controllable elementary LEDs arranged on top of and in contact with control circuit 171 is obtained. This structure may then be cut into individual chips, each comprising a single display device.

An advantage of the method described in relation with FIGS. 1 to 7 is that it comprises no step of cutting of growth substrate 121 into individual chips. This is particularly advantageous in the case of a growth substrate made of sapphire, which material is particularly difficult to cut.

Another advantage of the method described in relation with FIGS. 1 to 7 is that the step of disassembly of growth substrate 121 is carried out before the transfer of active LED stack 120 on semiconductor substrate 170 inside and on top of which control circuits 171 are integrated. This enables, in the case where such a disassembly is performed by projection of a laser beam through substrate 121 (lift-off laser type method), not to risk damaging control circuits 171.

Another advantage is linked to the possibility of thinning and/or of structuring semiconductor layer 123 from its surface opposite to semiconductor layer 127, after the removal of growth substrate 121 and before the transfer of active LED stack 120 onto the second temporary transfer substrate 151 (steps of FIG. 3). The thinning step particularly enables to correct possible thickness unevennesses of layer 123.

It should further be noted that, during the step of transfer of chips 160 onto substrate 170, it may be provided to select the transferred chips based on a mapping of defects, particularly of thickness unevennesses, formed during a step prior to the transfer, for example, before the cutting of substrate 151 into individual chips. This particularly enables to eliminate the chips 160 having critical defects.

Another advantage of the method described in relation with FIGS. 1 to 7 is that, due to the cutting of active LED stack 120 into individual chips before the transfer onto semiconductor substrate 170, losses of material linked to possible size differences between semiconductor substrate 170 (for example, a substrate having a diameter in the order of 200 or 300 mm) and the growth substrate 121 of the LED stack (for example, a substrate having a diameter in the order of 100 mm) are minimized. Further, chips selected according to a thickness mapping may originate from different growth substrates and be gathered on a semiconductor substrate 170 of large size (in the order of 200 or 300 mm) while having a homogeneous thickness, although coming from different epitaxy sources. Such a thickness homogeneity enables to aim, in the rest of the manufacturing process, at larger screen resolutions and pixel densities.

Figure 8:
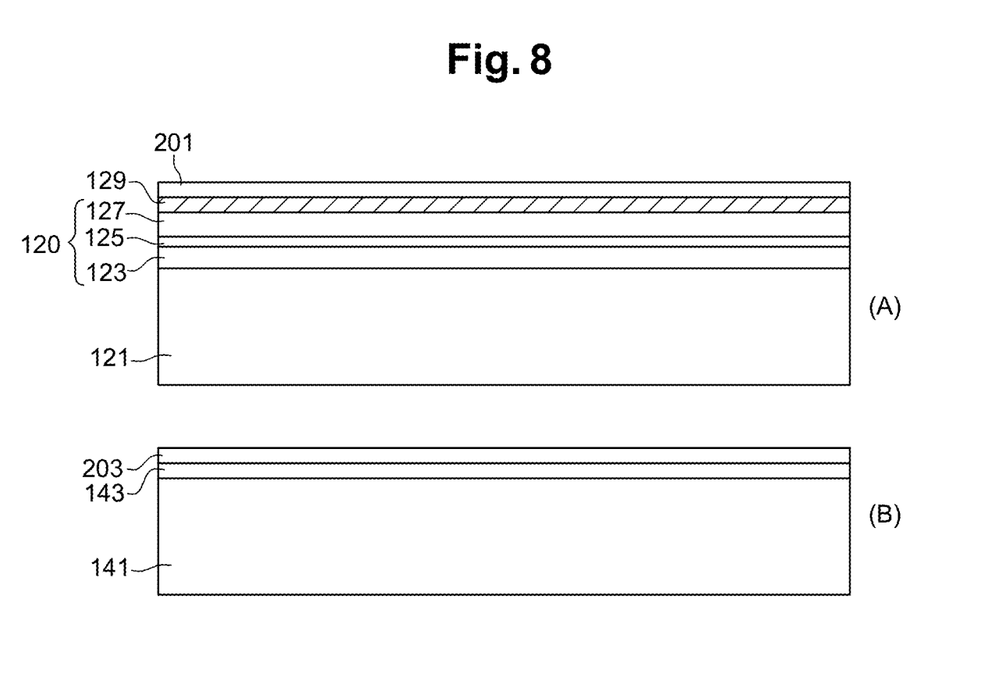
FIG. 8 schematically illustrates a step of a first alternative implementation mode of the method of FIGS. 1 to 7.
Figure 9:
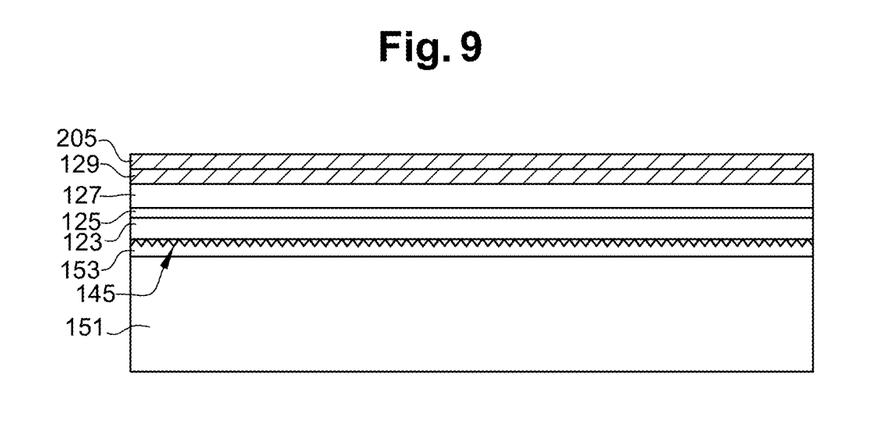
FIG. 9 schematically illustrates another step of the first alternative implementation mode of the method of FIGS. 1 to 7.

FIGS. 8 and 9 illustrate an alternative implementation mode of the method described in relation with FIGS. 1 to 7.

FIG. 8 comprises a view (A) similar to the view (A) of FIG. 1, showing a structure obtained at the end of steps of forming of an active LED stack 120 on the upper surface of a growth substrate 121. FIG. 8 further comprises a view (B) similar to the view (B) of FIG. 1, illustrating a structure obtained at the end of a step of preparation of a first temporary transfer substrate 141 intended to be bonded to the surface of active LED stack 120 opposite to growth substrate 121.

The variant of FIG. 8 differs from what has been previously described in relation with FIG. 1 in that, in the variant of FIG. 8, metal layer 129 is coated with a dielectric layer 201, for example, made of silicon oxide, continuously extending over substantially the entire surface of substrate 121. Dielectric layer 201 is for example in contact with the upper surface of metal layer 129.

In this example, metal layer 129 is for example formed of a stack of a plurality of different metal layers (not detailed in FIG. 8) comprising, in the following order from the upper surface of semiconductor layer 127:
- a first metal layer, for example, made of nickel, of indium, of titanium, or of an indium tin oxide (ITO), in contact with the upper surface of semiconductor layer 127 and allowing an electric contact with semiconductor layer 127; and
- a second metal layer, for example, made of aluminum, of silver, or of platinum, in contact with the upper surface of the first metal layer, having an optical reflector function.

The variant of FIG. 8 further differs from what has been previously described in relation with FIG. 1 in that, in the variant of FIG. 8, the metal layer 140 coating temporary substrate 141 is omitted and replaced with a dielectric layer 203, for example, made of the same material as layer 201, for example, silicon oxide or silicon nitride. Dielectric layer 203 continuously extends over substantially the entire surface of temporary substrate 141. Dielectric layer 203 is for example in contact with the upper surface of stop layer 143.

In the variant of FIGS. 8 and 9, the bonding of active LED stack 120 is obtained by direct bonding of the surface of dielectric layer 201 opposite to substrate 121 to the surface of dielectric layer 203 opposite to substrate 141. In other words, the direct metal-to-metal bonding described in relation with FIG. 2 is replaced with a direct dielectric-to-dielectric bonding.

The next steps of the method are identical or similar to what has been previously described, until the removal of the first temporary transfer substrate 141 (FIG. 4).

FIG. 9 illustrates the structure obtained after the removal of first temporary transfer substrate 141. In this example, after having removed temporary transfer substrate 141, etch stop layer 143 and dielectric bonding layers 201 and 203 are also removed to expose the upper surface of metal layer 129. A metal bonding layer 205 continuously extending over the entire surface of active LED stack 120 may then be deposited on top of and in contact with the upper surface of layer 129. Layer 205 is intended to allow the implementation of a subsequent step of direct metal-to-metal bonding of the individual chips 160 onto the upper surface of semiconductor substrate 170 (FIG. 6). Layer 205 is for example made of the same material as layer 175 of FIG. 6, for example, titanium. A step of preparation of the surface of layer 205 opposite to layer 129 may be provided, for example, by chemical-mechanical polishing, to obtain a relatively low surface roughness of layer 205, for example, smaller than 0.5 nm RMS.

The next steps of the method are for example identical or similar to what has been described in relation with FIGS. 5 to 7.

Figure 10:
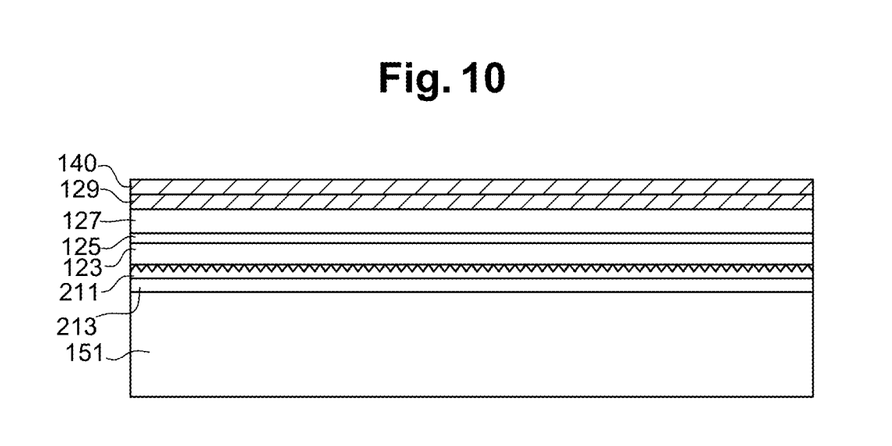
FIG. 10 schematically illustrates a step of a second alternative implementation mode of the method of FIGS. 1 to 7.

FIG. 10 illustrates another alternative implementation mode of the method described in relation with FIGS. 1 to 7.

The variant of FIG. 10 differs from the example of FIGS. 1 to 7 mainly in that, in the variant of FIG. 10, the bonding of active LED stack 120 to the second transfer substrate 151 is not performed by means of polymer glue 153 (FIG. 4) but by direct dielectric-to-dielectric bonding. For this purpose, before the transfer of active LED stack 120 onto substrate 151, a dielectric layer 211, for example, made of silicon oxide, is deposited on the surface of layer 123 opposite to the first temporary transfer substrate 141, and a dielectric layer 213, for example, made of the same material as layer 211, is deposited on the upper surface of substrate 151. Layer 211 continuously extends over substantially the entire surface of LED stack 120, and layer 213 continuously extends over substantially the entire surface of support substrate 151. The active LED stack is then bonded to substrate 151 by direct bonding of the surface of dielectric layer 211 opposite to substrate 141 to the surface of dielectric layer 213 opposite to substrate 151.

FIG. 10 shows a view similar to the view of FIG. 4, at the end of the step of removal of the first temporary transfer substrate 141.

The next steps of the method are for example identical or similar to what has been described in relation with FIGS. 5 to 7.

Various embodiments and variants have been described. It will be understood by those skilled in the art that certain features of these various embodiments and variants may be combined, and other variants will occur to those skilled in the art. In particular, the variant of FIGS. 8 and 9 and the variant of FIG. 10 may be combined.

Further, the steps of FIG. 3 of thinning and/or of nanostructuring of layer 123 may be omitted. As an example, only the step of nanostructuring of layer 123 is implemented, the previous step of thinning of layer 123 being omitted. In another variant, only the step of thinning of layer 123 is implemented, the step of nanostructuring of layer 123 being omitted. In another variant, the step of thinning of layer 123 and the step of nanostructuring of layer 123 are both omitted.

Further, the conductivity types of semiconductor layers 123 (type N in the described examples) and 127 (type P in the described examples) may be inverted.

Further, although only embodiments of display devices based on gallium nitride LEDs have been described, the described embodiments may be adapted to the manufacturing of a sensor comprising a plurality of gallium nitride photodiodes individually addressable to acquire an image.

More generally, the described embodiments may be adapted to the manufacturing of any display device or photosensitive sensor based on semiconductor diodes, including made up of semiconductor materials other than gallium nitride, for example, diodes made up of other III-V semiconductor materials.

The described embodiments may further be adapted to the manufacturing of any electronic device comprising a plurality of semiconductor components made up of gallium nitride or of other semiconductor materials, for example, III-V materials, and an integrated circuit capable of individually controlling the components. As an example, the semiconductor components may be power components, for example, transistors, diodes, etc.

Finally, the practical implementation of the embodiments and variants described herein is within the capabilities of those skilled in the art based on the functional indications provided hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing electronic devices, comprising the successive steps of:
   a) growing, on a surface of a first substrate, a stack comprising at least one semiconductor layer;
   b) bonding a second substrate to a surface of the stack opposite to the first substrate, and then removing the first substrate;
   c) bonding a third substrate to a surface of the stack opposite to the second substrate, and then removing the second substrate;
   d) cutting the assembly comprising the third substrate and the stack into a plurality of first chips, each comprising a portion of the stack; and
   e) bonding each first chip, by its surface opposite to the third substrate, to a surface of a fourth semiconductor substrate inside and on top of which a plurality of integrated control circuits have been previously formed,
   wherein, at step b):
   I) the second substrate is bonded to the surface of the stack opposite to the first substrate by direct bonding of a first metal layer previously deposited on the surface of the stack opposite to the first substrate with a second metal layer previously deposited on the second substrate, or
   II) the second substrate is bonded to the surface of the stack opposite to the first substrate by direct bonding of a first dielectric layer previously deposited on the surface of the stack opposite to the first substrate with a second dielectric layer previously deposited on the second substrate.

2. The method according to claim 1, wherein each control circuit comprises a plurality of metal connection pads and wherein, at step e), the first chips are respectively arranged opposite the control circuits so that, in each first chip, said at least one semiconductor layer of the stack is electrically connected to the metal pads of the corresponding control circuit.

3. The method according to claim 2, further comprising, after step e), the step of:
   f) cutting the assembly comprising the fourth semiconductor substrate and the first chips into a plurality of electronic devices each comprising one of said integrated control circuits and the corresponding portion of the stack.

4. The method according to claim 3, further comprising, after step e) and before step f), a step of removal of the third substrate in each first chip.

5. The method according to claim 3, further comprising, after step e) and before step f), a step of forming, in each of said portions of the stack, trenches delimiting a plurality of individually-controllable components.

6. The method according to alternative I) of claim 1, wherein the first and second metal layers are made of titanium.

7. The method according to alternative II) of claim 1, wherein the first and second dielectric layers are made of silicon oxide.

8. The method according to claim 1, wherein, at step c), the third substrate is bonded to the surface of the stack opposite to the second substrate by means of a bonding layer made of a polymer material.

9. The method according to claim 1, wherein, at step c), the third substrate is bonded to the surface of the stack opposite to the second substrate by direct oxide-to-oxide bonding.

10. The method according to claim 1, further comprising, after step b) and before step c), a step of thinning said at least one semiconductor layer from its surface opposite to the second substrate.

11. The method according to claim 1, further comprising, after step b) and before step c), a step of forming of nanostructures in said at least one semiconductor layer on the side of its surface opposite to the second substrate.

12. The method according to claim 1, wherein the first substrate is made of sapphire.

13. The method according to claim 1, wherein said at least one semiconductor layer comprises gallium nitride.

14. The method according to claim 1, wherein the stack is a diode stack comprising, in the following order from said surface of the first substrate, first and second semiconductor layers of opposite conductivity types.

15. A method of manufacturing electronic devices, comprising the successive steps of:
   a) growing, on a surface of a first substrate, a stack comprising at least one semiconductor layer;
   b) bonding a second substrate to a surface of the stack opposite to the first substrate, and then removing the first substrate;
   c) bonding a third substrate to a surface of the stack opposite to the second substrate, and then removing the second substrate;
   d) cutting the assembly comprising the third substrate and the stack into a plurality of first chips, each comprising a portion of the stack; and
   e) bonding each first chip, by its surface opposite to the third substrate, to a surface of a fourth semiconductor substrate inside and on top of which a plurality of integrated control circuits have been previously formed,
   wherein each control circuit comprises a plurality of metal connection pads and wherein, at step e), the first chips are respectively arranged opposite the control circuits so that, in each first chip, said at least one semiconductor layer of the stack is electrically connected to the metal pads of the corresponding control circuit,
   the method further comprising, after step e), the step of:
   f) cutting the assembly comprising the fourth semiconductor substrate and the first chips into a plurality of electronic devices each comprising one of said integrated control circuits and the corresponding portion of the stack.

16. A method of manufacturing electronic devices, comprising the successive steps of:
   a) growing, on a surface of a first substrate, a stack comprising at least one semiconductor layer;
   b) bonding a second substrate to a surface of the stack opposite to the first substrate, and then removing the first substrate;
   c) bonding a third substrate to a surface of the stack opposite to the second substrate, and then removing the second substrate;
   d) cutting the assembly comprising the third substrate and the stack into a plurality of first chips, each comprising a portion of the stack; and
   e) bonding each first chip, by its surface opposite to the third substrate, to a surface of a fourth semiconductor substrate inside and on top of which a plurality of integrated control circuits have been previously formed,
   wherein, at step c), the third substrate is bonded to the surface of the stack opposite to the second substrate by direct oxide-to-oxide bonding.

17. A method of manufacturing electronic devices, comprising the successive steps of:
   a) growing, on a surface of a first substrate, a stack comprising at least one semiconductor layer;
   b) bonding a second substrate to a surface of the stack opposite to the first substrate, and then removing the first substrate;
   c) bonding a third substrate to a surface of the stack opposite to the second substrate, and then removing the second substrate;
   d) cutting the assembly comprising the third substrate and the stack into a plurality of first chips, each comprising a portion of the stack; and
   e) bonding each first chip, by its surface opposite to the third substrate, to a surface of a fourth semiconductor substrate inside and on top of which a plurality of integrated control circuits have been previously formed,
   the method further comprising, after step b) and before step c), a step of thinning said at least one semiconductor layer from its surface opposite to the second substrate.

18. A method of manufacturing electronic devices, comprising the successive steps of:
   a) growing, on a surface of a first substrate, a stack comprising at least one semiconductor layer;
   b) bonding a second substrate to a surface of the stack opposite to the first substrate, and then removing the first substrate;
   c) bonding a third substrate to a surface of the stack opposite to the second substrate, and then removing the second substrate;
   d) cutting the assembly comprising the third substrate and the stack into a plurality of first chips, each comprising a portion of the stack; and
   e) bonding each first chip, by its surface opposite to the third substrate, to a surface of a fourth semiconductor substrate inside and on top of which a plurality of integrated control circuits have been previously formed,
   the method further comprising, after step b) and before step c), a step of forming of nanostructures in said at least one semiconductor layer on the side of its surface opposite to the second substrate.

* * * * *

UNITED STATES PATENT AND TRADEMARK OFFICE
CERTIFICATE OF CORRECTION

| | | |
|---|---|---|
| PATENT NO. | : 11,329,188 B2 | Page 1 of 1 |
| APPLICATION NO. | : 16/991857 | |
| DATED | : May 10, 2022 | |
| INVENTOR(S) | : Benaissa et al. | |

It is certified that error appears in the above-identified patent and that said Letters Patent is hereby corrected as shown below:

On the Title Page

Inventors, item (72):
"Lamine Benaissa, Massy (FR); Marc Rabarot, Saint-Egreve (FR)"
Should read:
"Lamine Benaissa, Grenoble Cedex 9 (FR); Marc Rabarot, Grenoble Cedex 9 (FR)"

Signed and Sealed this
Ninth Day of August, 2022

Katherine Kelly Vidal
*Director of the United States Patent and Trademark Office*